(12) United States Patent
Moore

(10) Patent No.: US 11,530,947 B1
(45) Date of Patent: Dec. 20, 2022

(54) LINEAR REGULATION OF SPAD SHUTOFF VOLTAGE

(71) Applicant: STMicroelectronics (Research & Development) Limited, Marlow (GB)

(72) Inventor: John Kevin Moore, Edinburgh (GB)

(73) Assignee: STMicroelectronics (Research & Development) Limited, Marlow (GB)

( * ) Notice: Subject to any disclaimer, the term of this patent is extended or adjusted under 35 U.S.C. 154(b) by 0 days.

(21) Appl. No.: 17/370,230

(22) Filed: Jul. 8, 2021

(51) Int. Cl.
*G01J 1/44* (2006.01)

(52) U.S. Cl.
CPC ........... *G01J 1/44* (2013.01); *G01J 2001/442* (2013.01); *G01J 2001/4466* (2013.01)

(58) Field of Classification Search
CPC . G01J 1/44; G01J 2001/442; G01J 2001/4466
See application file for complete search history.

(56) References Cited

U.S. PATENT DOCUMENTS

| | | | | |
|---|---|---|---|---|
| 6,259,612 B1* | 7/2001 | Itoh | .................. | H02M 3/07 363/60 |
| 2004/0245436 A1* | 12/2004 | Matsumoto | ........ | H04B 10/6911 250/238 |
| 2010/0014875 A1* | 1/2010 | Uto | .................... | H04B 10/6911 398/202 |
| 2010/0200781 A1* | 8/2010 | Khorasani | ............ | H01L 31/101 250/576 |
| 2016/0223397 A1* | 8/2016 | Tsai | ......................... | G01J 1/44 |
| 2018/0017632 A1* | 1/2018 | Moore | ..................... | G05F 1/46 |
| 2019/0123215 A1* | 4/2019 | Stark | ..................... | H01L 31/107 |
| 2020/0319355 A1* | 10/2020 | Aull | .................. | H01L 27/14687 |

\* cited by examiner

*Primary Examiner* — Thanh Luu
*Assistant Examiner* — Monica T Taba
(74) *Attorney, Agent, or Firm* — Crowe & Dunlevy

(57) ABSTRACT

Described herein is an electronic device, including a pixel and a turn-off circuit. The pixel includes a single photon avalanche diode (SPAD) having a cathode coupled to a high voltage node and an anode selectively coupled to ground through an enable circuit, and a clamp diode having an anode coupled to the anode of the SPAD and a cathode coupled to a turn-off voltage node. The turn-off circuit includes a sense circuit coupled between the turn-off voltage node and ground and configured to generate a feedback voltage, and a regulation circuit configured to sink current from the turn-off voltage node to ground based upon the feedback voltage such that a voltage at the turn-off voltage node maintains generally constant.

16 Claims, 4 Drawing Sheets

LINEAR REGULATION OF SPAD SHUTOFF VOLTAGE

TECHNICAL FIELD

This disclosure is directed to a circuit for linearly regulating a shutoff voltage for a single photon avalanche diode (SPAD).

BACKGROUND

Single photon avalanche diode (SPAD) photodetectors are based on a PN junction that is reverse biased at a voltage exceeding a breakdown voltage. When a photon-generated carrier (via the internal photoelectric effect) is injected into the depletion region of the PN junction, a self-sustaining avalanche ensues, and detection of current output as a result of this avalanche can be used to indicate detection of the photon that generated the carrier.

An example prior art SPAD pixel 1 is shown in FIG. 1. The pixel 11 includes a SPAD D1 having its cathode coupled to a high voltage supply VHV through a quench resistance Rq and its anode coupled to the drain of an n-channel transistor T1. Transistor T1 in turn has its source coupled to the drain of an n-channel transistor T2, which has its drain coupled to ground. Transistor T1 is biased by a first control signal Ctrl1, which has a fixed voltage, while transistor T2 is biased by switching control signal Ctrl2. A clamp diode D2 has its anode coupled to the anode of the SPAD D1 and its cathode coupled to an off voltage for the SPAD D1, labeled as VSPADOFF.

When control signal Ctrl2 goes high, it turns on, connecting the anode of the SPAD D1 to ground, setting the reverse bias voltage of the SPAD D1 above the breakdown voltage, while the clamp diode D2 disconnects the anode of the SPAD D1 from the VSPADOFF voltage. When an incoming photon strikes the SPAD D1, its cathode voltage will swing between the high voltage and a lower voltage, creating a current pulse that is detected by the detection module 2. The avalanche is quenched by the quench resistance Rq, resetting the SPAD D1 for the next detection. The purpose for control signal Ctrl1 being a fixed voltage is to bias the transistor T1 so that it limits the current inrush to transistor T2 during the avalanche, protecting T2 from damage.

There are multiple different types of SPADs that may be used in such pixels. For some SPAD types, such as fully depleted SPADs, difficulties are encountered when it is desired to keep the SPAD off (e.g., where the control signal Ctrl2 is set such that the transistor T2 is off), because to keep the SPAD off, the anode voltage is to be kept around 5 to 7 volts. This is sufficiently high that it would damage the transistors T1 and T2.

As such, further development is needed into techniques for keeping such the SPAD of a pixel turned off when desired.

SUMMARY

Disclosed herein is an electronic device, including a pixel, the pixel including: a single photon avalanche diode (SPAD) having a cathode coupled to a high voltage node, and an anode selectively coupled to ground through an enable circuit; and a clamp diode having an anode coupled to the anode of the SPAD and a cathode coupled to a turn-off voltage node. The electronic device includes a turn-off circuit, the turn-off circuit including: a sense circuit coupled between the turn-off voltage node and ground and configured to generate a feedback voltage; and a regulation circuit configured to sink current from the turn-off voltage node to ground based upon the feedback voltage such that a voltage at the turn-off voltage node maintains generally constant.

When the SPAD has its anode disconnected from ground by the enable circuit and is exposed to light, the SPAD may generate a photocurrent that flows from the anode of the SPAD, through the clamp diode to the turn-off voltage node, and through the sense circuit to ground. The amount of current sunk by the regulation circuit from the turn-off voltage node may be proportional to the amount of photocurrent flowing through the sense circuit.

The regulation circuit may include an amplifier having a first input coupled to a reference voltage and a second input coupled to receive the feedback voltage, and a transistor having a gate coupled to an output of the amplifier, a first conduction terminal coupled to the turn-off voltage node, and a second conduction terminal coupled to ground.

The first input of the amplifier may be an inverting input and the reference voltage may be a bandgap voltage, and the second input of the amplifier may be a non-inverting input and may be coupled to receive the feedback voltage.

The transistor may include an n-channel transistor having a drain coupled to the turn-off voltage node, a source coupled to ground, and a gate coupled to the output of the amplifier.

The sense circuit may include a resistive divider coupled between the turn-off voltage node and ground, with the feedback voltage being generated at a tap node of the resistive divider.

An additional diode may have an anode coupled to a supply voltage and a cathode coupled to the turn-off voltage node.

The SPAD may be a fully depleted SPAD formed using a three dimensional layout.

The cathode of the SPAD may be coupled to the high voltage node through a quench resistance.

The pixel may also include a readout circuit coupled to the cathode of the SPAD by a decoupling capacitor.

Also disclosed herein is a turn-off circuit for a single photon avalanche diode (SPAD) pixel, including: a turn-off voltage node receiving a photocurrent from the SPAD pixel when the SPAD pixel is in a non-avalanche mode of usage; and a regulation circuit configured to sink a current from the turn-off voltage node that is proportional to the photocurrent such that a voltage at the turn-off voltage node remains generally constant regardless of a value of the photocurrent.

A sense circuit may be coupled between the turn-off voltage node and ground, the sense circuit being configured to generate a feedback voltage based upon a current flowing through the sense circuit to ground. The regulation circuit may sink the current from the turn-off voltage node based upon the feedback voltage.

The regulation circuit may include an amplifier having a first input coupled to a reference voltage and a second input coupled to the feedback voltage, and a transistor having a gate coupled to an output of the amplifier, a first conduction terminal coupled to the turn-off voltage node, and a second conduction terminal coupled to ground.

An additional diode may have an anode coupled to a supply voltage and a cathode coupled to the turn-off voltage node.

Also disclosed herein is a method, including: causing a single photon avalanche diode (SPAD) to generate a photocurrent while not avalanching; and maintaining an anode of the SPAD at a turn-off voltage sufficient to keep the SPAD from being in an avalanchable condition by: flowing a constant current through a resistive divider to provide the turn-off voltage; permitting the photocurrent to flow through the resistive divider; and reducing the constant current proportionally to a value of the photocurrent such that the turn-off voltage stays substantially constant regardless of the value of the photocurrent.

Reducing the constant current proportionally to the value of the photocurrent such that the turn-off voltage stays substantially constant regardless of the value of the photocurrent may be performed by comparing a feedback voltage at a tap node of the resistive divider to a reference voltage, and causing a current sink to sink an amount of the constant current based upon the feedback voltage.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Figure 1:
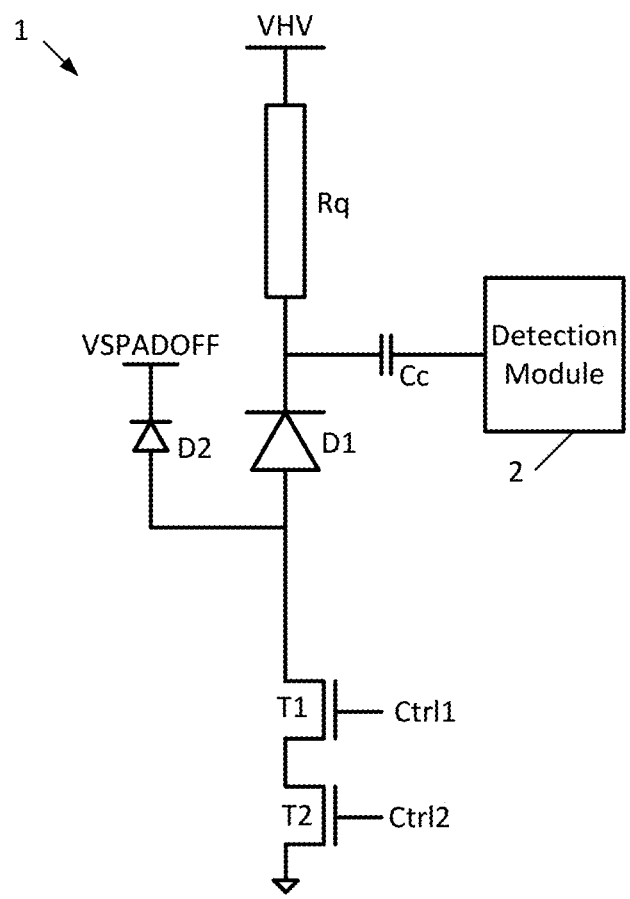
FIG. 1 is a schematic block diagram of a single photon avalanche diode (SPAD) pixel according to the prior art.
Figure 2:
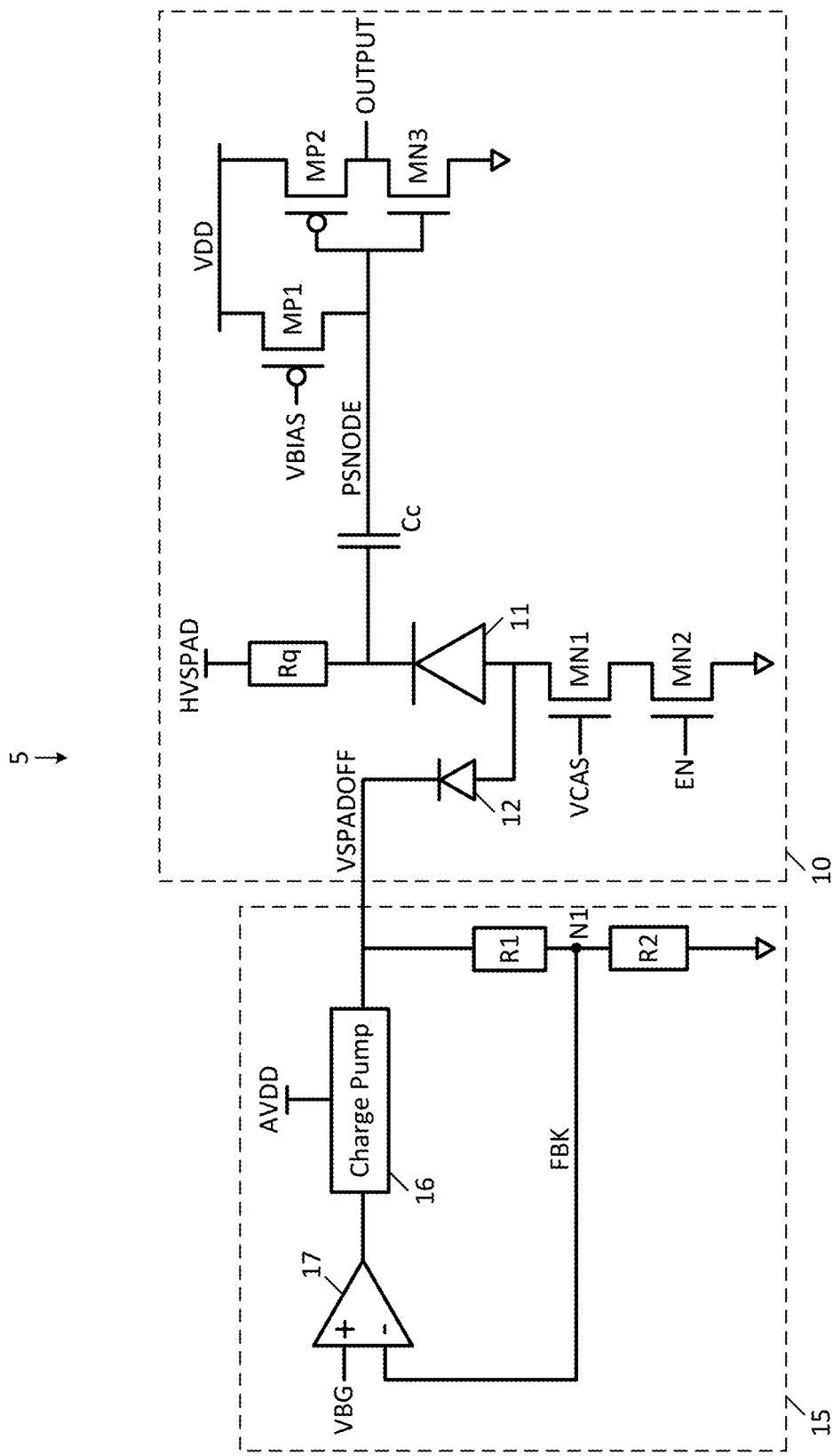
FIG. 2 is a schematic diagram of a first electronic device including a SPAD pixel and a turn-off circuit, as disclosed herein.

Now described with reference to FIG. 2 is a first device 5 containing a SPAD pixel 10 and turn-off circuitry 15. The SPAD pixel 10 includes a SPAD 11, which may be a fully depleted three dimensional SPAD, having its cathode coupled to a high voltage HVSPAD (on the order of 20-25 V, for example 23 V) through a quench resistance Rq and having its anode coupled to ground through series connected n-channel transistors MN1 and MN2.

N-channel transistor MN1 is an extended-drain MOS capable of handling a drain to source voltage having a high voltage level (for example, on the order of 5 to 7 volts or higher). N-channel transistor MN1 has its drain directly electrically connected to the anode of the SPAD 11, its gate coupled to receive a cascode voltage VCAS, and its source directly electrically connected to the drain of n-channel transistor MN2.

N-channel transistor MN2 is also an extended-drain MOS capable of handling a drain to source voltage of 5 to 7 volts or higher. N-channel transistor MN2 has its drain directly electrically connected to the source of n-channel transistor MN1, its gate coupled to receive an enable voltage EN, and its source directly electrically connected to ground.

A capacitor Cc is coupled between the cathode of the SPAD 11 and a detection circuit formed by a CMOS inverter (series connected p-channel transistor MP2 and n-channel transistor MN3) coupled between a supply voltage VDD (e.g., 1.2 V) and ground, with a bias p-channel transistor MP1 coupled between the input of the CMOS inverter (gates of MP2 and MN3) and the supply voltage. The gate of transistor is coupled to receive a bias voltage VBIAS.

When it is desired for the SPAD 11 to be on and act as a SPAD (i.e., avalanche when struck by an incoming photon), the enable signal EN is asserted, turning on n-channel transistor MN2 to thereby couple the anode of the SPAD 11 to ground, setting the reverse bias of the SPAD 11 above its breakdown voltage, while clamp diode 12 disconnects the anode of the SPAD 11 from the VSPADOFF voltage (e.g., 7 V).

The capacitor Cc functions as an isolation capacitor, isolating the detection circuit from the cathode voltage. The node PSNODE is charged to the supply voltage VDD by the bias transistor MP1 being properly biased by the bias voltage BIAS.

Figure 4:
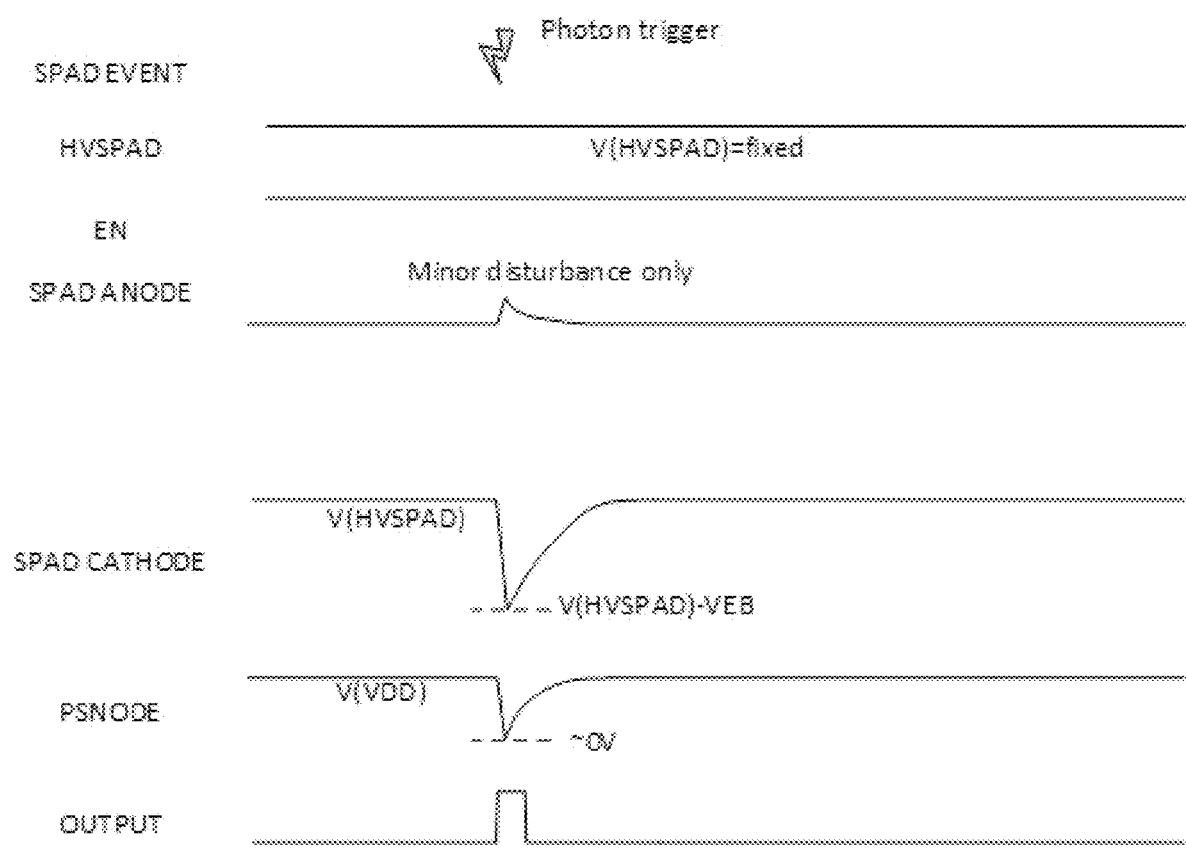
FIG. 4 is a schematic diagram of the second electronic device when enabled.

When an incoming photon strikes the SPAD 11, the SPAD 11 will avalanche, and its cathode voltage will swing between the high voltage and a lower voltage and then charge back up as the avalanche is quenched by the quench resistance Rq. This AC swing is coupled by the capacitor Cc onto the node PSNODE, and is inverted by the inverter formed by MP2 and MP3 to produce the output signal OUTPUT, such as shown in the timing diagram of FIG. 4.

For the case where it is desired for the SPAD 11 to be off, the turn-off circuitry 15 comes into play. The turn-off circuitry 15 includes a resistive divider formed by series connected resistances R1 and R2 connected between the cathode of the clamp diode 12 and ground. A charge pump 16 provides the voltage VSPADOFF to the cathode of the clamp diode 12. Input to the charge pump 16 is provided by amplifier 17, which has a non-inverting terminal coupled to receive a bandgap voltage VBG and an inverting terminal coupled to a tap node N1 between resistances R1 and R to receive a feedback voltage FBK. Note that the loop of the amplifier 17, charge pump 16, and feedback voltage FBK may be considered to be a regulation circuit.

To turn off the SPAD 11, the enable signal EN is released, turning off n-channel transistor MN2, allowing the anode of the SPAD 11 to float. VSPADOFF is pumped by the charge pump 16 to a voltage (e.g., 7 volts) such that VSPADOFF, along with diode 12, clamps the anode of the SPAD 11 to around VSPADOFF+Vt. Note that thermally or optically induced carriers within the SPAD 11 are relied upon in order for this voltage to be reached.

However, in high light conditions, even though the SPAD 11 is not biased to act as a SPAD (meaning that the control signal EN is such that transistor MN1 is off), the SPAD 11 nevertheless acts as a photodiode, and a photocurrent will be generated. The photocurrent flows from HVSPAD, through the SPAD 11 to the anode of the SPAD 11, to the anode of the clamp diode 12, which flows as reverse bias current through the clamp diode 12 to the resistive divider formed by resistances R1 and R2.

So that the current through the resistive divider formed by resistances R1 and R2 does not increase, which would increase VSPADOFF, based upon the output from the amplifier 17 (which compares the feedback signal FBK to the bandgap voltage VBG), the current output by the charge pump 16 is lowered so as to maintain the voltage VSPADOFF at a steady level.

Notice therefore that as the photocurrent increases, the current output by the charge pump 16 decreases. Thus, the maximum current provided by the charge pump 16 (drawn from the power supply voltage AVDD) occurs in low light conditions. Since the VSPADOFF voltage should be at a voltage much higher than the maximum supply to the chip, there is a need for it to be generated by a charge pump or boost converter. Although a charge pump can prove more economical than a booster converter, it expensive in terms of area, and consumes an undesirable amount of power. As an example, if AVDD is 3.3V, the current provided by the charge pump 16 to the resistors R1 and R2 is near 2 mA. As can be appreciated, as the number of SPAD pixels 10 included within the device 5 increases, the current consumption therefore increases and can become significant.

Thus, while the design of the device 5 is quite successful in enabling the use of fully depleted SPADs, yet further improvements may be made so as to reduce area and power consumption.

Figure 3:
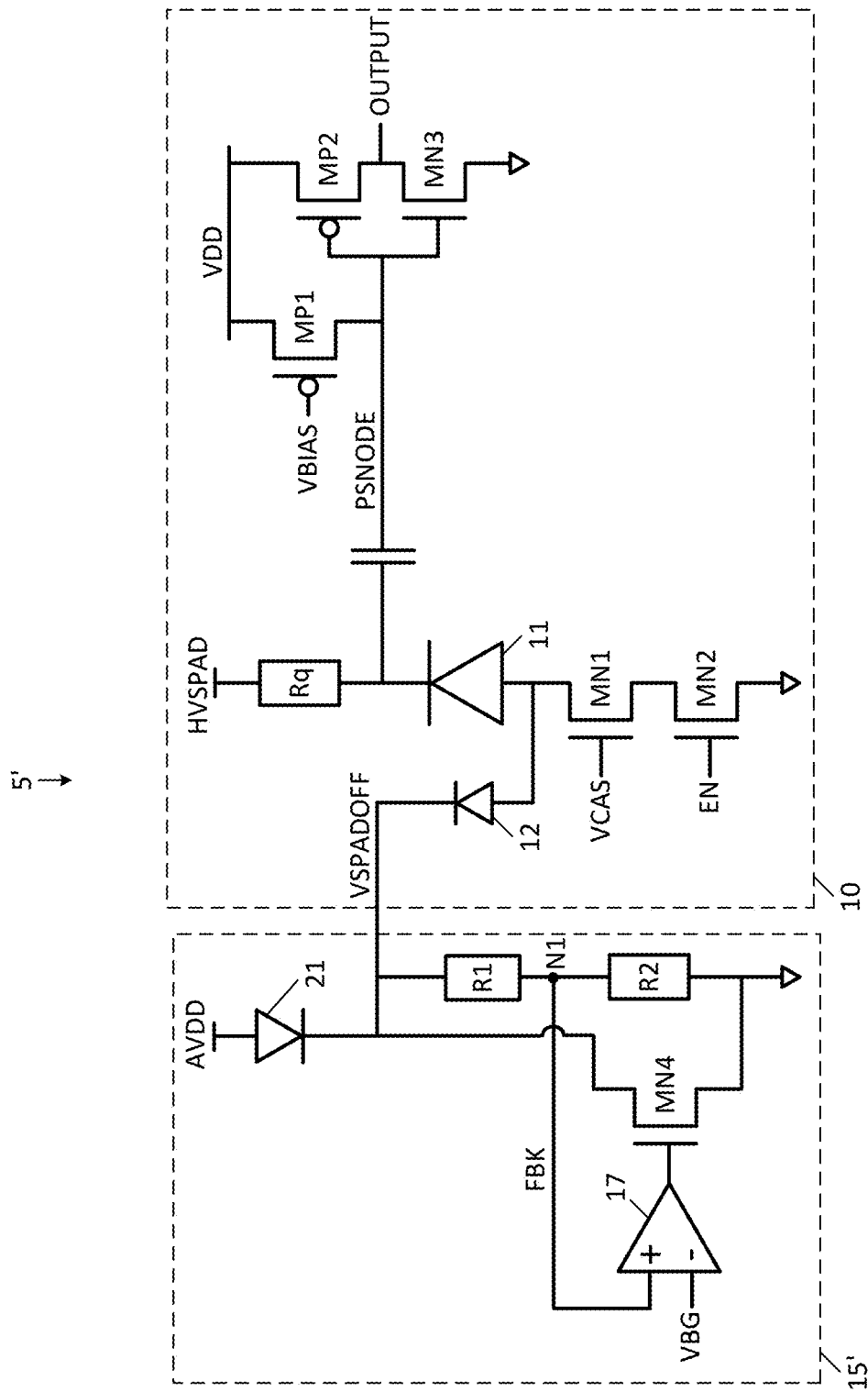
FIG. 3 is a schematic diagram of a second electronic device including a SPAD pixel and a turn-off circuit, as disclosed herein.

An improved device 5' is shown in FIG. 3. In this improved device 5', the SPAD pixel 10 remains the same, but the turn-off circuitry 15' is changed. In normal operation when the SPAD 11 is on (meaning that the enable signal EN is asserted to turn on n-channel transistor MN2, coupling the anode of the SPAD 11 to ground, while the clamp diode 12 disconnects the anode of the SPAD 11 from the VSPADOFF voltage), operation is as described above.

Namely, when an incoming photon strikes the SPAD 11, the SPAD 11 will avalanche, and its cathode voltage will swing between the high voltage and a lower voltage and then charge back up as the avalanche is quenched by the quench resistance Rq. This AC swing is coupled by the capacitor Cc onto the node PSNODE, and is inverted by the inverter formed by MP2 and MP3 to produce the output signal OUTPUT.

Operation of the improved device 5' to keep the SPAD 11 off will be described below, but first, the turn-off circuitry 15' will be described. The turn-off circuitry 15' includes a voltage divider formed by series connected resistances R1 and R2 that are coupled between the cathode of the clamp diode 12 and ground. The resistances R1 and R2 in the turn-off circuitry 15' are preferably higher in resistance value than that of the resistances of the turn-off circuitry 15 of the device 5 shown in FIG. 2.

An additional diode 21 has its anode coupled to the supply voltage AVDD and its cathode coupled to the cathode of the clamp diode 12. An n-channel transistor MN4 has its drain directly electrically connected to the cathode of the clamp diode 12 and its source directly electrically connected to ground.

An amplifier 17 has its inverting terminal coupled to a bandgap voltage VBG, its non-inverting terminal coupled to a tap node N1 between resistances R1 and R2 to receive a feedback signal FBK, and its output coupled to the gate of the n-channel transistor MN4.

Note that the n-channel transistor MN4 may be a drift MOS and capable of handling high voltage, or may be any other high-voltage transistor such as a high-voltage MOS or high-voltage BJT.

In operation, the amplifier 17, n-channel transistor MN4, and feedback signal FBK form a static feedback loop. When the SPAD 11 is off (meaning the enable signal EN is deasserted, turning off n-channel transistor MN2), in high light conditions, a photocurrent is generated by the SPAD 11 as explained above and flows from the anode of the SPAD 11, through the clamp diode 12 as a reverse current (since the clamp diode 12 is reverse biased), and into the resistances R1 and R2. In this case, when the feedback voltage FBK exceeds the bandgap voltage VBG, the amplifier 17 causes the n-channel transistor MN4 to sink some of the reverse current sufficient to maintain a constant current through the resistances R1 and R2, and maintain the voltage VSPAD-OFF at a constant level. Thus, in this configuration of the improved device 5', observe that it is not just the clamp diode 12 that sets the anode voltage of the SPAD 11 when the SPAD 11 is off, but it is also the photocurrent from the anode of the SPAD 11 that sets the anode voltage of the SPAD 11.

Note that the diode 21 may be omitted if desired, but when present, serves to pre-charge VSPADOFF and set VSPAD-OFF to be a minimum of VDD minus the threshold voltage.

In a sample operation case, the bandgap voltage VBG may be 1V (for example, in the case of a trimmed bandgap voltage), the supply voltage AVDD may be 3.3V, the voltage HVSPAD may be 20-25V, and VSPADOFF may be 7V. In this case, the resistance value of R1 is six times the resistance value of R2.

The device 5' described above has advantages over the device 5 in that it consumes less area and consumes less power, thereby increasing efficiency. The device 5' may be used in applications such as time-of-flight ranging (for example, direct time of flight ranging application for automotive and consumer usage), and light detection and ranging (LiDAR).

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. An electronic device, comprising:
   a pixel comprising:
      a single photon avalanche diode (SPAD) having a cathode coupled to a high voltage node, and an anode selectively coupled to ground through an enable circuit; and
      a clamp diode having an anode coupled to the anode of the SPAD and a cathode coupled to a turn-off voltage node; and
   a turn-off circuit comprising:
      a sense circuit coupled between the turn-off voltage node and ground and configured to generate a feedback voltage; and
      a regulation circuit configured to sink current from the turn-off voltage node to ground based upon the feedback voltage such that a voltage at the turn-off voltage node maintains generally constant.

2. The electronic device of claim 1,
   wherein when the SPAD has its anode disconnected from ground by the enable circuit and is exposed to light, the SPAD generates a photocurrent that flows from the anode of the SPAD, through the clamp diode to the turn-off voltage node, and through the sense circuit to ground; and
   wherein an amount of current sunk by the regulation circuit from the turn-off voltage node is proportional to an amount of photocurrent flowing through the sense circuit.

3. The electronic device of claim 1, wherein the regulation circuit comprises:
   an amplifier having a first input coupled to a reference voltage and a second input coupled to receive the feedback voltage; and
   a transistor having a gate coupled to an output of the amplifier, a first conduction terminal coupled to the turn-off voltage node, and a second conduction terminal coupled to ground.

4. The electronic device of claim 3, wherein the first input of the amplifier is an inverting input and the reference voltage is a bandgap voltage, and wherein the second input of the amplifier is a non-inverting input and is coupled to receive the feedback voltage.

5. The electronic device of claim 4, wherein the transistor comprises an n-channel transistor having a drain coupled to the turn-off voltage node, a source coupled to ground, and a gate coupled to the output of the amplifier.

6. The electronic device of claim 5, wherein the sense circuit comprises a resistive divider coupled between the turn-off voltage node and ground, with the feedback voltage being generated at a tap node of the resistive divider.

7. The electronic device of claim 3, further comprising an additional diode having an anode coupled to a supply voltage and a cathode coupled to the turn-off voltage node.

8. The electronic device of claim 1, wherein the SPAD is a fully depleted SPAD formed using a three dimensional layout.

9. The electronic device of claim 1, wherein the cathode of the SPAD is coupled to the high voltage node through a quench resistance.

10. The electronic device of claim 1, wherein the pixel further comprises a readout circuit coupled to the cathode of the SPAD by a decoupling capacitor.

11. A turn-off circuit for a single photon avalanche diode (SPAD) pixel, comprising:
   a turn-off voltage node receiving a photocurrent from the SPAD pixel when the SPAD pixel is in a non-avalanche mode of usage; and
   a regulation circuit configured to sink a current from the turn-off voltage node that is proportional to the photocurrent such that a voltage at the turn-off voltage node remains generally constant regardless of a value of the photocurrent.

12. The turn-off circuit of claim 11, further comprising a sense circuit coupled between the turn-off voltage node and ground, the sense circuit being configured to generate a feedback voltage based upon a current flowing through the sense circuit to ground; and wherein the regulation circuit sinks the current from the turn-off voltage node based upon the feedback voltage.

13. The turn-off circuit of claim 12, wherein the regulation circuit comprises:
   an amplifier having a first input coupled to a reference voltage and a second input coupled to the feedback voltage; and
   a transistor having a gate coupled to an output of the amplifier, a first conduction terminal coupled to the turn-off voltage node, and a second conduction terminal coupled to ground.

14. The turn-off circuit of claim 11, further comprising an additional diode having an anode coupled to a supply voltage and a cathode coupled to the turn-off voltage node.

15. A method, comprising:
   causing a single photon avalanche diode (SPAD) to generate a photocurrent while not avalanching; and
   maintaining an anode of the SPAD at a turn-off voltage sufficient to keep the SPAD from being in an avalanchable condition by:
      flowing a constant current through a resistive divider to provide the turn-off voltage;
      permitting the photocurrent to flow through the resistive divider; and
      reducing the constant current proportionally to a value of the photocurrent such that the turn-off voltage stays substantially constant regardless of the value of the photocurrent.

16. The method of claim 15, wherein reducing the constant current proportionally to the value of the photocurrent such that the turn-off voltage stays substantially constant regardless of the value of the photocurrent comprises:
   comparing a feedback voltage at a tap node of the resistive divider to a reference voltage; and
   causing a current sink to sink an amount of the constant current based upon the feedback voltage.

* * * * *